United States Patent
Lee et al.

(10) Patent No.: US 8,963,137 B2
(45) Date of Patent: Feb. 24, 2015

(54) ORGANIC LIGHT-EMITTING DISPLAY DEVICE AND METHOD OF FABRICATING THE SAME

(71) Applicant: LG Display Co., Ltd., Seoul (KR)

(72) Inventors: Joon-Suk Lee, Seoul (KR); Se-June Kim, Paju-Si (KR); JuhnSuk Yoo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/707,310

(22) Filed: Dec. 6, 2012

(65) Prior Publication Data

US 2013/0099218 A1 Apr. 25, 2013

Related U.S. Application Data

(63) Continuation-in-part of application No. 13/415,655, filed on Mar. 8, 2012.

(30) Foreign Application Priority Data

Sep. 2, 2011 (KR) .................. 10-2011-0089277

(51) Int. Cl.
*H01L 29/08* (2006.01)
*H01L 51/00* (2006.01)
(Continued)

(52) U.S. Cl.
CPC ........ *H01L 51/5203* (2013.01); *H01L 51/5012* (2013.01); *H01L 27/1259* (2013.01); *H01L 27/3246* (2013.01); *H01L 27/3279* (2013.01)
USPC .......... 257/40; 257/59; 257/72; 257/E51.018; 257/E51.019; 439/99; 439/155; 439/151

(58) Field of Classification Search
USPC .............................. 257/40; 313/504
See application file for complete search history.

(56) References Cited

U.S. PATENT DOCUMENTS 5,773,931 A * 6/1998 Shi et al. ................. 313/509
5,952,037 A * 9/1999 Nagayama et al. ........... 427/66
(Continued)

FOREIGN PATENT DOCUMENTS

| CN | 101340754 A | 1/2009 |
|---|---|---|
| JP | 2008-135325 A | 6/2008 |
| KR | 10-0929167 B1 | 12/2009 |

OTHER PUBLICATIONS

German Patent and Trademark Office, Office Action, German Patent Application No. 10 2012 107 977.3, Mar. 19, 2014, ten pages.
(Continued)

*Primary Examiner* — Matthew W Such
*Assistant Examiner* — Samuel Lair
(74) *Attorney, Agent, or Firm* — Fenwick & West LLP

(57) ABSTRACT

An organic electro-luminescence device capable of reducing a resistance of a cathode electrode to enhance brightness uniformity at each location within the device is described. The organic electro-luminescence device includes a bank layer formed over a substrate, the bank layer including a first, second, and third portion. A first electrode is formed between the first and second portions of the bank layer. An auxiliary electrode is formed where at least a part of the auxiliary electrode is formed between the second and third portions of the bank layer. A voltage drop prevention pattern is formed on the auxiliary electrode. An organic material layer formed between the first and second portions of the bank layer. A second electrode formed on the organic material layer, where at least a portion of the second electrode is electrically coupled to the auxiliary electrode.

31 Claims, 11 Drawing Sheets

(51) Int. Cl.
*H01L 51/52* (2006.01)
*H01L 51/50* (2006.01)
*H01L 27/32* (2006.01)
*H01L 27/12* (2006.01)

(56) References Cited

U.S. PATENT DOCUMENTS

| | | | |
|---|---|---|---|
| 6,037,712 A * | 3/2000 | Codama et al. | 313/498 |
| 6,373,187 B1 * | 4/2002 | Nagayama et al. | 313/506 |
| 6,628,069 B2 * | 9/2003 | Chung et al. | 313/506 |
| 7,095,172 B2 * | 8/2006 | Sakamoto et al. | 313/506 |
| 7,417,371 B2 * | 8/2008 | Birnstock et al. | 313/506 |
| 2002/0158835 A1 | 10/2002 | Kobayashi et al. | |
| 2004/0160176 A1 * | 8/2004 | Kim | 313/506 |
| 2005/0214577 A1 | 9/2005 | Sakamoto et al. | |
| 2008/0074041 A1 * | 3/2008 | Nakayama | 313/504 |
| 2009/0009069 A1 * | 1/2009 | Takata | 313/504 |
| 2013/0099218 A1 | 4/2013 | Lee et al. | |

OTHER PUBLICATIONS

United States Office Action, U.S. Appl. No. 13/415,655, Jan. 21, 2014, fourteen pages.
United States Office Action, U.S. Appl. No. 13/415,655, Sep. 12, 2013, fifteen pages.
State Intellectual Property Office of the People's Republic of China, First Office Action, Chinese Patent Application No. 201210320541.3, Dec. 24, 2014, thirty pages.

* cited by examiner

ORGANIC LIGHT-EMITTING DISPLAY DEVICE AND METHOD OF FABRICATING THE SAME

CROSS REFERENCE TO RELATED APPLICATIONS

This application is a continuation-in-part application of, and claims the benefit under 35 U.S.C. §120 from, co-pending U.S. patent application Ser. No. 13/415,655, entitled "Organic Light-Emitting Display Device and Method of Fabricating the Same," filed on Mar. 8, 2012, which application claims the benefit of Korean Patent Application No. 10-2011-0089277, filed on Sep. 2, 2011, the subject matters of both of which are hereby incorporated by reference in their entirety.

BACKGROUND OF THE DISCLOSURE

1. Field of the Disclosure

The present invention relates to an organic electro-luminescence device and a method of fabricating the same.

2. Discussion of the Related Art

In recent years, there has been increased use of portable electronic devices such as notebooks and personal mobile devices. These devices include display devices. In order to maximize their per-battery charge lifespan, ideally these display device are constructed using light weight and low power consumption technologies, for example using flat panel displays (FPDs) such as liquid crystal displays (LCD) and organic electro-luminescence devices.

Organic electro-luminescence devices have advantages over other display technologies including, for example, having high brightness, having low operation voltage characteristics, having a high contrast ratio because of being operated as a self luminous type display that spontaneously emits light, capability of being implemented in an ultra-thin display, facilitating the implementation of moving images using a response time of several microseconds (μs), having no limitation in viewing angle, having stability even at low temperatures, and allowing flexible fabrication and design of a driving circuit due to operation at low direct current voltages, for example between 5 to 15 V.

The organic electro-luminescence device may be classified into a passive matrix type or an active matrix type. In the passive matrix type, the device may be configured with a matrix form in which the gate and data lines are crossed with each other, and the gate lines are sequentially driven as time passes to drive each pixel. Thus, to achieve a given instantaneous brightness an amount of power equaling the average brightness multiplied by the number of lines may be required at all time to display the instantaneous brightness.

In an active matrix type uses thin-film transistors used for switching individual pixels on and off, a first electrode coupled to the thin-film transistor may be turned on or off for each sub-pixel unit, and a second electrode facing the first electrode may become a common electrode. Further, a voltage applied to the pixel may be charged at a storage capacitance (CST), and applied until the next frame signal is applied. Thus, in contrast to the passive matrix type, in an active matrix type a pixel may be continuously driven for one frame regardless of the number of gate lines. As a result, the same brightness can be obtained even if a comparatively lower current is applied. This has the advantage of providing a low power consumption even in a large screen sized display. In recent years, active matrix type organic electro-luminescence devices have been increasingly widely used for at least this reason.

FIG. 1 is a circuit diagram illustrating one pixel of a typical active matrix type organic electro-luminescence device. Referring to FIG. 1, one pixel of the active matrix type organic electro-luminescence device may include a switching thin-film transistor (STr), a driving thin-film transistor (DTr), a storage capacitor (StgC), and an organic electro-luminescence diode (D). A gate line (GL) may be formed in a first direction, and a data line (DL) may be formed in a second direction crossed with the first direction to form a pixel area (P), and a power line (PL) separated from the data line (DL) may be formed to apply a power voltage.

A switching thin-film transistor (STr) and a driving thin-film transistor (DTr) electrically coupled to the switching thin-film transistor (STr) may be formed at a portion where the data line (DL) and gate line (GL) intersect. A first electrode which is a terminal of the organic electro-luminescence diode (D) may be coupled to a drain electrode of the driving thin-film transistor (DTr), and a second electrode which is the other terminal thereof may be coupled to the power line (PL). Here, the power line (PL) may transfer a power voltage to the organic electro-luminescence diode (D). Also, a storage capacitor (StgC) may be formed between the gate electrode and the source electrode of the driving thin-film transistor (DTr).

When a signal is applied via the gate line (GL), the switching thin-film transistor (STr) is turned on, and a signal of the data line (DL) is transferred to a gate electrode of the driving thin-film transistor (DTr) to turn on the driving thin-film transistor (DTr), thereby emitting light through the organic electro-luminescence diode (D). At this time, when the driving thin-film transistor (DTr) enters an ON state, the level of a current flowing through the organic electro-luminescence diode (D) from the power line (PL) is determined, thereby determining a gray scale. The storage capacitor (StgC) may perform the role of constantly maintaining a gate voltage of the driving thin-film transistor (DTr) when the switching thin-film transistor (STr) is turned off, thereby constantly maintaining the level of the current flowing through the organic electro-luminescence diode (D) until the next frame, even if the switching thin-film transistor (STr) enters an OFF state before then. The organic electro-luminescence device performing such a driving operation may be classified into a top emission type and a bottom emission type.

FIG. 2 is a plan view illustrating a top emission type organic electro-luminescence device, and FIG. 3 is a cross-sectional view illustrating one pixel area including a driving thin-film transistor of the top emission type organic electro-luminescence device, as a cross-sectional view of an "A" portion of FIG. 2. Referring to FIGS. 2 and 3, a first and a second substrate 10, 70 are disposed to face each other, and an edge portion of the first and the second substrate 10, 70 is sealed by a seal pattern 80.

The driving thin-film transistor (DTr) is formed for each pixel area (P) and a first electrode 34 coupled to each driving thin-film transistors (DTr) via a contact hole 32 is formed at an upper portion of the first substrate 10, and an organic emitting layer 38 coupled to the driving thin-film transistor (DTr) and containing light-emitting materials corresponding to red, green and blue colors is formed at an upper portion of the first electrode 34, and a second electrode 42 is formed at a front surface of the upper portion of the organic emitting layer 38.

The first and the second electrode 34, 42 perform the role of applying a voltage to the organic emitting layer 38. A first auxiliary electrode 31 applies a voltage to the second electrode 42. The first auxiliary electrode 31 is formed at the same layer as the driving thin-film transistor (DTr). A second auxiliary electrode 36 is coupled to the first auxiliary electrode 31 via a contact hole 32. The second auxiliary electrode is formed at the same layer as the first electrode 34. Accordingly, the second electrode 42 receives a voltage via the first auxiliary electrode 31 and second auxiliary electrode 36.

Here, the second electrode 42 may be formed of a metal, particularly, with a thin thickness, for example, a thickness of less than 100 Å, to have a semi-transmissive property. If the second electrode 42 is formed with a low thickness, then a sheet resistance increases, and as a consequence the second electrode 42 receives a voltage via the second auxiliary electrode 36 and the first auxiliary electrode 31 formed at the outside of the panel, thereby causing a voltage drop as a result of the distance difference (and consequent resistance) between an edge region of the panel and a central portion. As a result, a brightness difference may be created between an edge region of the panel and a central portion thereof. This causes the image produced by the device to appear nonuniform with respect to brightness across the entire device.

SUMMARY

An organic electro-luminescence device capable of reducing a resistance of a cathode electrode to enhance brightness uniformity at each location within the device is described. The organic electro-luminescence device includes a bank layer formed over a substrate, the bank layer including a first, second, and third portion. A first electrode is formed between the first and second portions of the bank layer. An auxiliary electrode is formed where at least a part of the auxiliary electrode is formed between the second and third portions of the bank layer. A pattern is formed on the auxiliary electrode. An organic material layer is formed between the first and second portions of the bank layer. A second electrode is formed on the organic material layer, where at least a portion of the second electrode is electrically coupled to the auxiliary electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Figure 1:
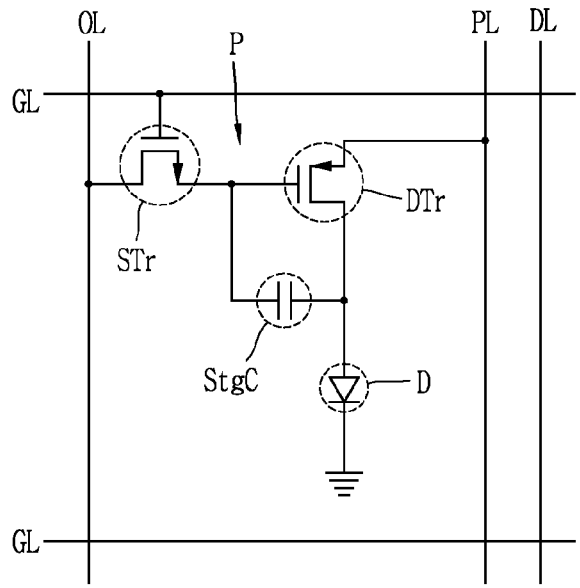
FIG. 1 is a circuit diagram illustrating one pixel of a typical active matrix type organic electro-luminescence device.
Figure 2:
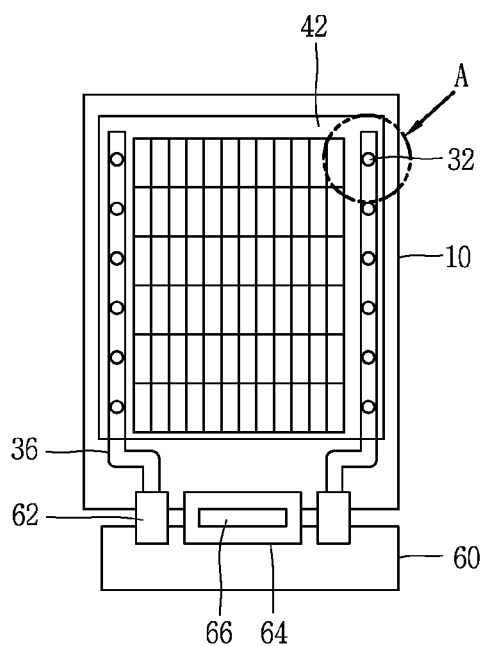
FIG. 2 is a plan view illustrating a top emission type organic electro-luminescence device.
Figure 3:
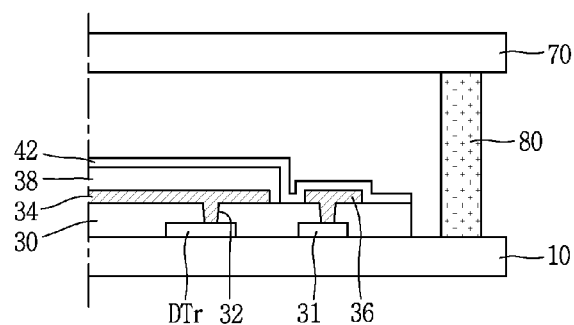
FIG. 3 is a cross-sectional view illustrating one pixel area including a driving thin-film transistor of the top emission type organic electro-luminescence device, as a cross-sectional view of an "A" portion of FIG. 2.
Figure 4:
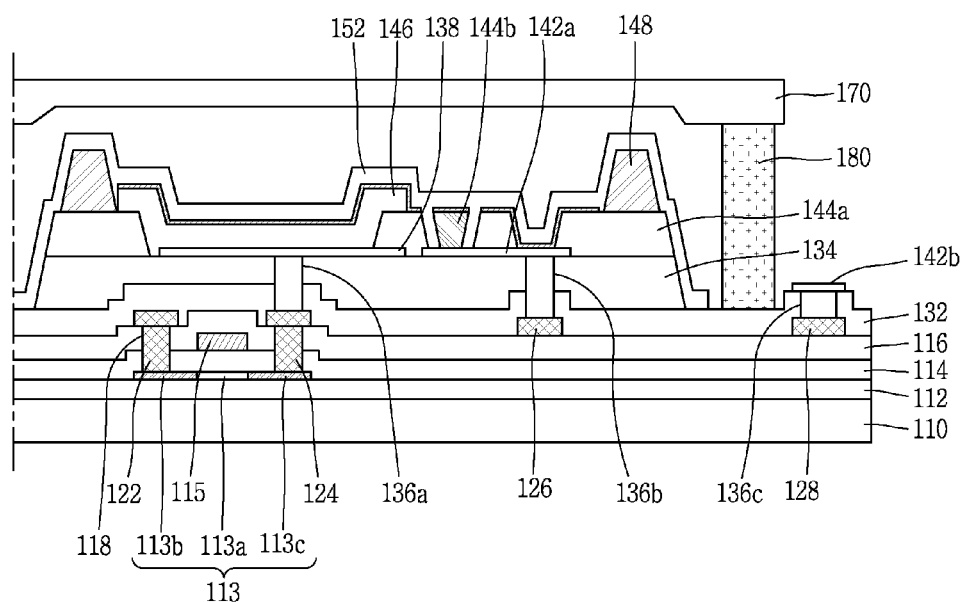
FIG. 4 is a cross-sectional view illustrating one pixel area including a driving thin-film transistor of an organic electro-luminescence device according to an embodiment of the present invention.
Figure 5:
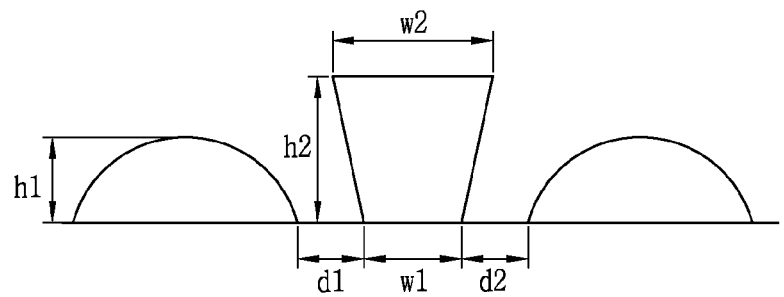
FIG. 5 is a cross-sectional view illustrating an actual voltage drop prevention pattern and bank.

FIG. 4 is a cross-sectional view illustrating one pixel area including a driving thin-film transistor of an organic electro-luminescence device according to an embodiment of the present invention. FIG. 5 is a cross-sectional view illustrating an actual voltage drop prevention pattern and bank. FIGS. 6A through 6E are plan views illustrating the shape of a voltage drop prevention pattern according to embodiments of the present invention.

Referring to FIG. 4, an organic electro-luminescence device according to an embodiment of the present invention is a top emission type, and includes driving and switching transistors (DTr) (as described below, 113, 114, and 115 in combination form the transistors), a first substrate 110 formed with an organic electro-luminescence diode (D), and a second substrate 170 for encapsulation.

A buffer layer 112 is formed on a driving area (DA) of the first substrate 110. A semiconductor layer 113 consisting of a first area 113a with pure polysilicon and second areas 113b, 113c doped with impurities is formed on the buffer layer 112. The buffer layer 112 is a layer for preventing the semiconductor layer 113 from being deteriorated due to the emission of alkali ions generated into an inner portion of the first substrate 110 when crystallizing the semiconductor layer 113.

A gate insulating layer 114 is formed on the semiconductor layer 113, and a gate electrode 115 is formed on the gate insulating layer 114 corresponding to the first area 113a of the semiconductor layer 113. An interlayer insulating layer 116 is formed on the gate electrode 115. A first contact hole 118 to expose the second areas 113b, 113c of the semiconductor layer 113 is formed on the interlayer insulating layer 116 and the gate insulating layer 114 at a lower portion of thereof.

A data line intersecting with a gate line (not shown) including the gate electrode 115 to define a pixel area is formed on the interlayer insulating layer 116. The data line may include a source and drain electrodes 122, 124 electrically coupled to the second areas 113b, 113c, respectively, of the semiconductor layer 113 through the first contact hole 118. Here, the source and drain electrodes 122, 124 may be formed with a multi-layer structure made of titanium (Ti), aluminium (Al), and titanium (Ti).

A first auxiliary electrode 126 and a second auxiliary electrode 128 are formed on the interlayer insulating layer 116. The first auxiliary electrode 126 is separated from the drain electrode 124 and the second auxiliary electrode 128 is separated from the first auxiliary electrode 126. A constant voltage, for example, a voltage Vss is applied to the first and the second auxiliary electrode 126, 128 from an external circuit.

The source and drain electrodes 122, 124, the semiconductor layer 113, the gate insulating layer 114, and the gate electrode 115 together constitute a driving transistor (DTr) and/or a switching transistor. The driving transistor (DTr) and switching transistor may form a P- or N-type transistor based on the doped impurities. A P-type transistor may be formed by doping a group III element, for example, boron (B), into the second areas 113b, 113c of the semiconductor layer 113. An N-type transistor may be formed by doping a group V element, for example, phosphor (P), into the second areas 113b, 113c of the semiconductor layer 113. The P-type transistor uses holes as a carrier, and the N-type transistor uses electrons as a carrier.

A first and a second passivation layers 132, 134 are formed at an upper portion of the driving transistor (DTr) and switching transistor. A second contact hole 136a for exposing the drain electrode 124 of the driving transistor (DTr) is formed on the first and second passivation layers 132, 134. A third contact hole 136b for exposing the first auxiliary electrode 126 is formed on the first and the second passivation layer 132, 134. A fourth contact hole 136c for exposing the second auxiliary electrode 128 is formed on the first passivation layer 132.

A first electrode 138 is formed on the second passivation layer 134. The first electrode 138 is electrically coupled to the drain electrode 124 through the second contact hole 136a. In this case, the first electrode 138 may be formed with a multilayer structure made of indium tin oxide (ITO), silver (Ag) and indium tin oxide (ITO) to implement the transmission of light. Also, a third auxiliary electrode 142a is formed on the second passivation layer 134. The third auxiliary electrode 142a is separate from the first electrode 138, however it is electrically coupled to the first auxiliary electrode 126 through the third contact hole 136b. Further, a fourth auxiliary electrode 142b is formed on the first passivation layer 132. The fourth auxiliary electrode 142b is electrically coupled to the second auxiliary electrode 128 through the fourth contact hole 136c.

A bank 144a is formed on both sides of the first electrode 138. The bank may also be formed to be overlapped with a side edge of the first electrode 138 in the shape of surrounding each pixel area. The banks 144a may be said to have multiple portions, where a first portion of the bank may be on one side of the pixel area, and the second portion of the bank may be on the other side of the pixel area.

A voltage drop prevention pattern 144b (or simply pattern 144b) is formed on a side upper portion of the third auxiliary electrode 142a. The pattern may be formed between the second portion of the bank 144a and a third portion of the bank 144a. The voltage drop prevention pattern 144b prevents a voltage drop from being produced by a sheet resistance of the second electrode 152. The voltage drop prevention pattern 144b may be formed of a negative photo resist. The voltage drop prevention pattern 144b formed at a side upper portion of the third auxiliary electrode 142a is formed so as to be separate from the bank 144a. The voltage drop prevention pattern 144b may also be formed to have an inverse tapered shape. The taper angle of the voltage drop prevention pattern 144b may vary depending upon the implementation.

The pattern 144b prevents the organic portions of the display device (described further below) from forming in between the second and third portions of the bank. This, for example, prevents the organic portions of the display device from coming into physical contact with the third auxiliary electrode 142a. The pattern 144b does not prevent, however, the second electrode 152 from forming and coupling physically and electrically to the third auxiliary electrode 142a. The pattern 144b thus serves to allow for a much larger contact area between the second electrode 152 and the third auxiliary electrode 142a. Due to the larger contact area between the second electrode 152 and the third auxiliary electrode 142a, the sheet resistance encountered by having a small contact area is reduced. As a result, there is little to no voltage drop at the point of contact between the second electrode 152 and the third electrode 142a.

As illustrated in FIG. 5, the height (h1) of the banks 144a formed on both sides of the voltage drop prevention pattern 144b are formed shorter than the height (h2) of the voltage drop prevention pattern 144b. For example, the height (h1) of the banks 144a may be 1.74 μm, whereas the height (h2) of the voltage drop prevention pattern 144b may be 1.86 μm. Continuing with the same example, a bottom width (w1) of the voltage drop prevention pattern 144b may be 7.078 μm whereas a top width (w2) of the voltage drop prevention pattern 144b may be 7.968 μm, Further, a distance (d1) between the voltage drop prevention pattern 144b and the bank 144a may be 5.203 μm, whereas a distance (d2) between the voltage drop prevention pattern 144b and the bank 144a may be 5.109 μm.

As stated above, the bank may include three portions. A second portion of the bank is formed between the first electrode and the voltage drop prevention pattern 144b. A third portion of the bank is formed on the opposite side of the voltage drop prevention pattern 144b from the second portion. The second electrode 152 may be formed between the second portion of the bank and the voltage drop prevention pattern 144b, and may also be formed between the voltage drop prevention pattern 144b and the third portion of the bank on the third auxiliary electrode 142a. The second electrode 152 directly and electrically connects to the third auxiliary electrode 142a to the first auxiliary electrode 126. The second electrode 152 has little to no contact resistance. Accordingly, it may be possible to prevent a voltage drop when a voltage is applied to the first and the second auxiliary electrode 126, 128 in the edge area of the panel. Without the voltage drop prevention pattern 144b, the voltage drop would be caused by a distance difference between an edge region of the panel and a central portion thereof.

FIGS. 6A through 6E are plan views illustrating the shapes of voltage drop prevention patterns according to embodiments of the present invention. The voltage drop prevention pattern 144b may be formed in various shapes.

Figure 6A:
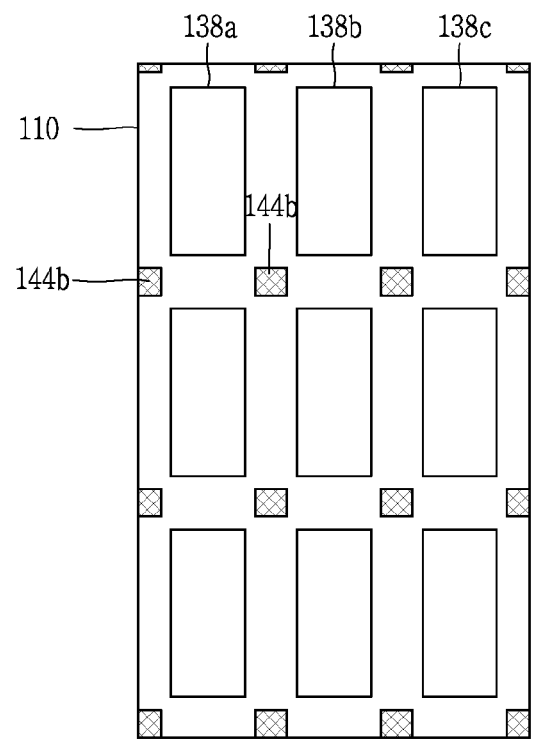
FIGS. 6A through 6E are plan views illustrating the shape of a voltage drop prevention pattern according to an embodiment of the present invention.

As illustrated in FIG. 6A, the first electrode 138 formed on the substrate 110 may include first through third sub-electrodes 138a to 138c, wherein the first sub-electrode 138a indicates a pixel electrode corresponding to R, the second sub-electrode 138b indicates a pixel electrode corresponding to G, and the third sub-electrode 138c indicates a pixel electrode corresponding to B. The voltage drop prevention pattern 144b may be formed in the remaining region not containing the sub-electrodes. Put another way, the pattern 144b may be formed outside the emission area of the display device. The emission area may be determined based on the borders of the organic material, or it may be determined based on the borders of the first, second, and third portions of the bank. The voltage drop prevention pattern 144b may be formed at horizontal and vertical intersections between the sub-electrodes. The voltage drop prevention pattern 144 may be formed in a rectangular shape, for example.

Figure 6B:
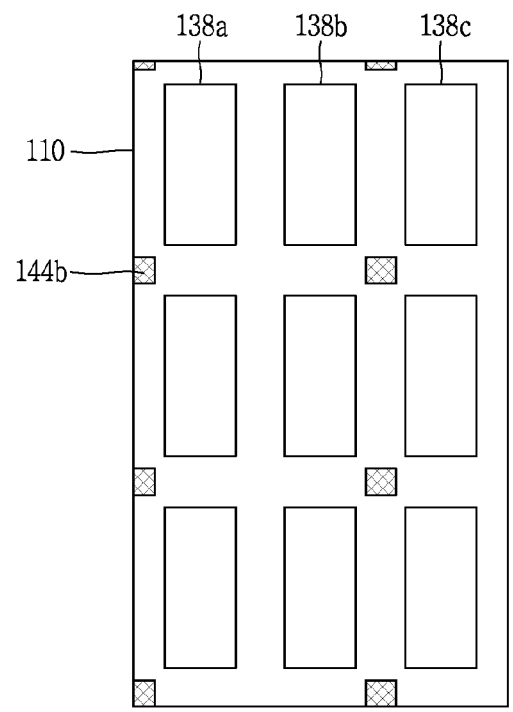

As illustrated in FIG. 6B, the voltage drop prevention pattern 144b may be formed in the remaining region not containing the sub-electrodes. The voltage drop prevention pattern 144b may be formed at positions where the horizontal and vertical directions are crossed with each other, only periodically between sub electrodes. For example, as illustrated in FIG. 6B, the voltage drop prevention pattern 144b may be formed between every other set of electrodes in the horizontal direction, and between every electrode in the vertical direction (or vice versa).

Figure 6C:
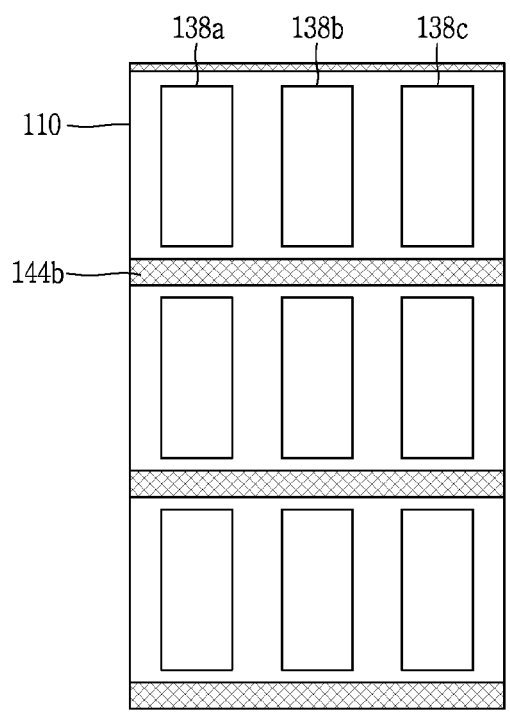

As illustrated in FIG. 6C, the voltage drop prevention pattern 144b may be formed in the remaining region not containing the sub-electrodes. For example, the voltage drop prevention pattern 144b may be formed in a horizontal direction between each sub-electrode, and may be formed in a bar shape.

Figure 6D:
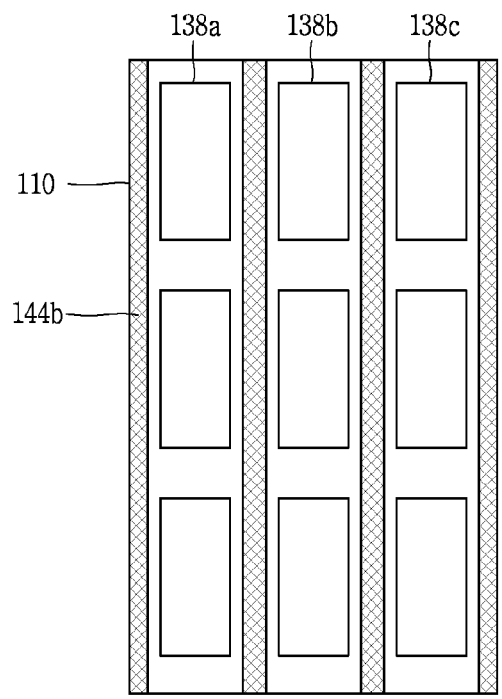

As illustrated in FIG. 6D, the voltage drop prevention pattern 144b may be formed in the remaining region not containing the sub-electrodes. For example, the voltage drop prevention pattern 144b may be formed in a vertical direction between each sub-electrode, and may be formed in a bar shape.

Figure 6E:
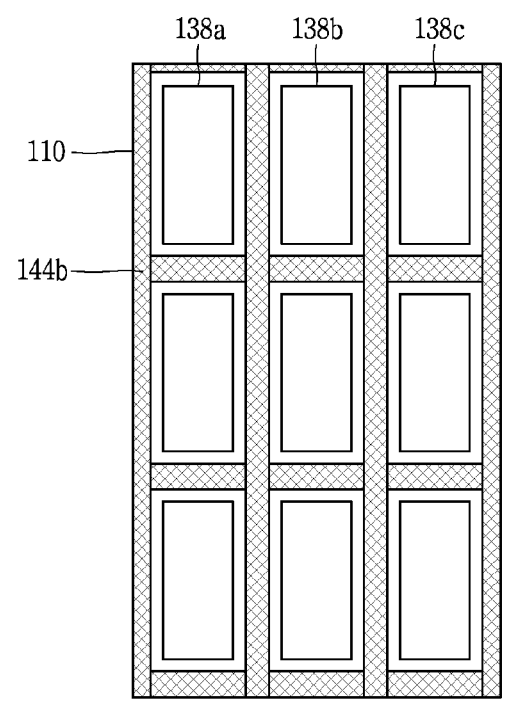

As illustrated in FIG. 6E, the voltage drop prevention pattern 144b may be formed in the remaining region not containing the sub-electrodes. For example, the voltage drop prevention pattern 144b may be formed in a crossed pattern in both the horizontal and vertical directions between each sub-electrode, and may be formed in a bar shape.

An organic emitting layer 146 made of a multilayer structure is formed at an upper portion of the first electrode 138. The first electrode 138 coupled to the drain electrode 124 of the driving thin-film transistor (DTr) performs the role of an anode or cathode electrode based on the type of the driving thin-film transistor (DTr). The first electrode 138 performs the role of an anode electrode when the driving thin-film transistor (DTr) is a P-type. The first electrode 138 performs the role of a cathode electrode when the driving thin-film transistor (DTr) is an N-type. When the first electrode 138 performs the role of an anode electrode, the organic emitting layer 146 may include a hole injection layer, a hole transporting layer, an emission layer, an electron transporting layer and an electron injection layer. When the first electrode 138 performs the role of an cathode electrode, the organic emitting layer 146 may include an electron injection layer, an electron transporting layer, an emission layer, a hole transporting layer, and a hole injection layer.

Spaces 148 are formed at regular intervals on the portions of the bank 144a.

The second electrode 152 is formed at a front surface of the substrate including the organic emitting layer 146. The second electrode 152 may be formed of a transparent conductive material such as indium tin oxide (ITO) or indium zinc oxide (IZO). The second electrode 152 is formed between the bank 144a and voltage drop prevention pattern 144b and between the voltage drop prevention pattern 144b and bank 144a on the third auxiliary electrode 142a. The second electrode 152 electrically connects the third auxiliary electrode 142a to the first auxiliary electrode 126.

A second substrate 170 is disposed to face the first substrate 110. An edge portion of the first and the second substrate 110, 170 is sealed by a seal pattern 180. A gap is maintained between the second electrode 152 the second substrate 170.

According to an embodiment 1 of the present invention, all elements are formed on the first substrate and thus a method of fabricating the first substrate is described. In this example, the device is a top emission type organic electro-luminescence device where the first electrode coupled to a drain electrode of the driving transistor (DTr) performs the role of an anode electrode and the second electrode performs the role of a cathode electrode.

Figure 7A:
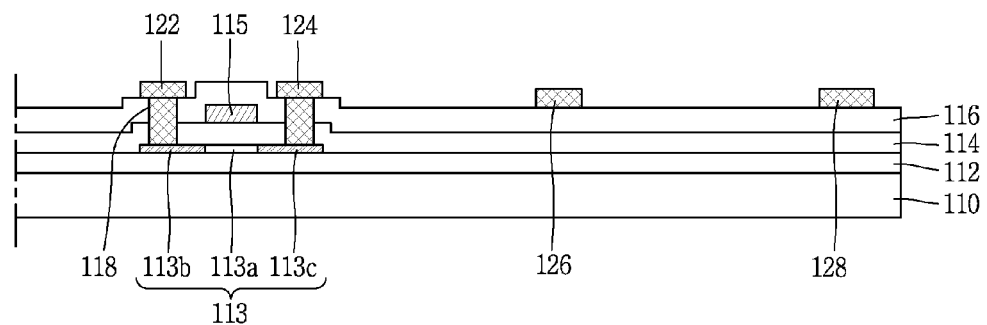
FIGS. 7A through 7E are process cross-sectional views for each fabrication step illustrating one pixel area of an organic electro-luminescence device according to a first embodiment of the present invention.

FIGS. 7A through 7E are process cross-sectional views for each fabrication step illustrating one pixel area of an organic electro-luminescence device according to a first embodiment of the present invention. Referring to FIG. 7A, an inorganic insulating material, for example, silicon oxide (SiO2) or silicon nitride (SiNx), is deposited on the insulating substrate 110 to form the buffer layer 112.

Amorphous silicon is deposited on the buffer layer 112 to form an amorphous silicon layer (not shown), and then the amorphous silicon is crystallized into a polysilicon layer (not shown) by irradiating a laser beam or performing a thermal processing on the amorphous silicon. A mask process is performed to pattern the polysilicon layer (not shown), thereby forming the semiconductor layer 113 in a pure polysilicon layer state.

A nonconductive material such as silicon oxide (SiO2), for example, is deposited on the semiconductor layer 113 with pure polysilicon to form the gate insulating layer 114. Molybdenum tungsten (MoW), for example, is deposited on the gate insulating layer 114 to form a first metal layer (not shown), and a mask process is performed on the first metal layer to form the gate electrode 115 on the gate insulating layer 114 corresponding to the first area 113a of the semiconductor layer 113.

An impurity, i.e., a group III element or group V element is doped into a front surface of the substrate 110 using the gate electrode 115 as a blocking mask to form the second areas 113b, 113c. The second areas 113b, 113c are doped with impurities at a portion located at the outside of the gate electrode 120 of the semiconductor layer 113. Doping is prevented in the first area 113a containing pure or nearly pure polysilicon at a portion corresponding to the gate electrode 120.

An inorganic insulating material, for example, silicon nitride (SiNx) or silicon oxide (SiO2) is deposited at a front surface of the substrate 110 formed with the semiconductor layer 113, divided into the first and the second areas 113a, 113b, 113c, to form the interlayer insulating layer 116. The interlayer insulating layer 116 and the gate insulating layer 114 are simultaneously or collectively patterned by performing a mask process. The mask process also creates the first contact hole 118 for exposing the second areas 113b, 113c, respectively.

A second metal layer (not shown) having a multilayer structure, for example, made of titanium (Ti), aluminium (Al), and titanium (Ti), is formed on the interlayer insulating layer 116. The second metal layer is patterned by performing a mask process to form the source and drain electrodes 122, 124. The second metal layer is electrically coupled to the second area 113b through the first contact hole 118. The first and the second auxiliary electrode 126, 128 are formed on the interlayer insulating layer 116. The first auxiliary electrode 126 is separate from the drain electrode 124, and the second auxiliary electrode 128 is separate from the first auxiliary electrode 126.

Figure 7B:
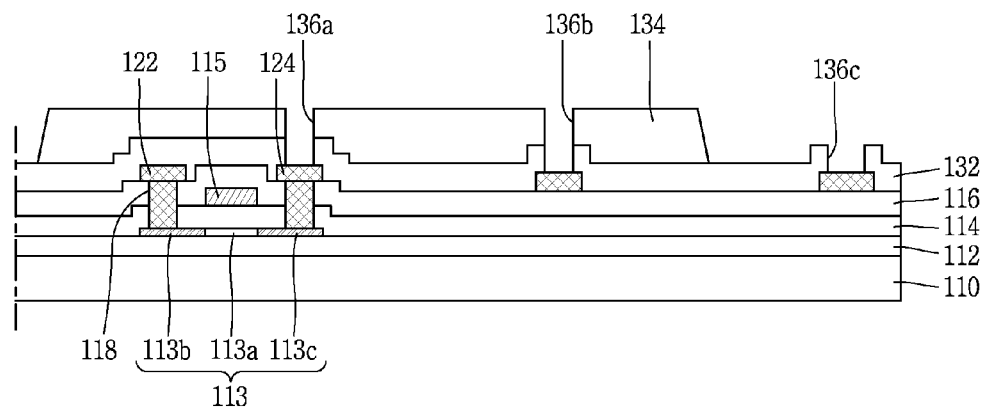

Referring to FIG. 7B, an inorganic insulating material such as silicon nitride (SiNx), for example, is deposited at a front surface of the substrate 110 including the source and drain electrodes 122, 124 to form the first passivation layer 132. An organic insulating material such as photo acryl (PA), for example, is deposited on the first passivation layer 132 to form the second passivation layer 134. The second contact hole 136a for exposing the drain electrode 124 and the third contact hole 136b for exposing the first auxiliary electrode 126 are formed on the first and the second passivation layers 132, 134. At substantially the same time, the fourth contact hole 136c for exposing the second auxiliary electrode 128 is formed thereon.

Figure 7C:
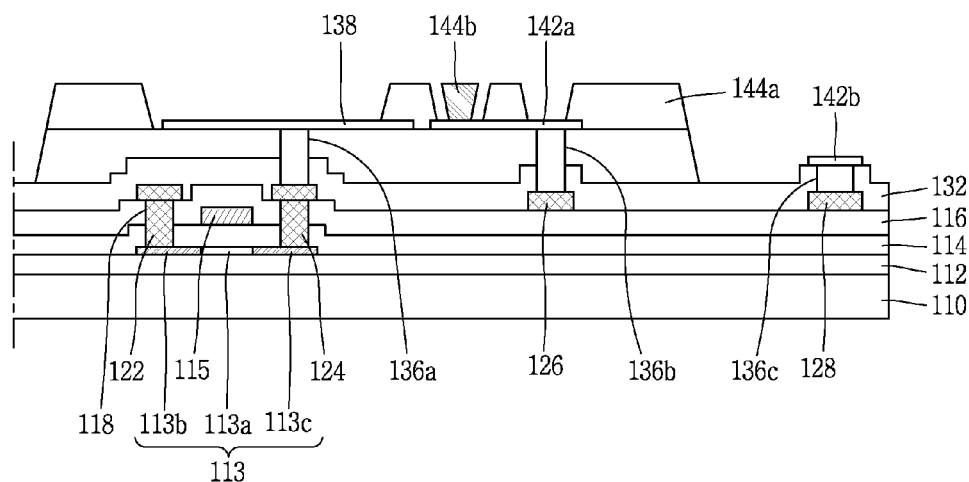

Referring to FIG. 7C, a third metal layer (not shown) having a multilayer structure, for example, made of indium tin oxide (ITO), silver (Ag) and indium tin oxide (ITO), is formed on the second passivation layer 134. The third metal layer is patterned by performing a mask process to form the first electrode 138 electrically coupled to the drain electrode 124 through the second contact hole 136a. At substantially the same time, the third and the fourth auxiliary electrode 142a, 142b are formed. The third and fourth auxiliary electrodes 142a, 142b are electrically coupled to the first and the second auxiliary electrode 126, 128 through the third and the fourth contact hole 136b, 136c.

An insulating material such as polyimide (PI), for example, is formed on the first electrode 138. The insulating material is patterned by performing a mask process to form banks 144a at both sides of the first electrode 138. The insulating material is formed to be overlapped with a side edge of the first electrode 138 in the shape of surrounding each pixel area.

A negative photo resist may be formed on the banks 144a. The negative photo resist is patterned by performing a mask process to form the voltage drop prevention pattern 144b on a side upper portion of the third auxiliary electrode 142a. The voltage drop prevention pattern 144b is formed to be separated from the bank 144a, and is formed to have an inverse tapered shape.

When the voltage drop prevention pattern 144b is formed on a side upper portion of the third auxiliary electrode 142a as described above, the second electrode 152 is formed between the bank 144a and the voltage drop prevention pattern 144b. The second electrode 152 is formed between the voltage drop prevention pattern 144b and the bank 144a on the third auxiliary electrode 142a to electrically connect the third auxiliary electrode 142a to the first auxiliary electrode 126. When a voltage is applied through the first auxiliary electrode 126 from an external circuit, the first auxiliary electrode 126 is directly coupled to the second electrode 152 to prevent a voltage drop caused by a distance difference between an edge region of the panel and a central portion thereof. As a result, brightness uniformity can be maintained at a uniform level across all location within the panel.

Figure 7D:
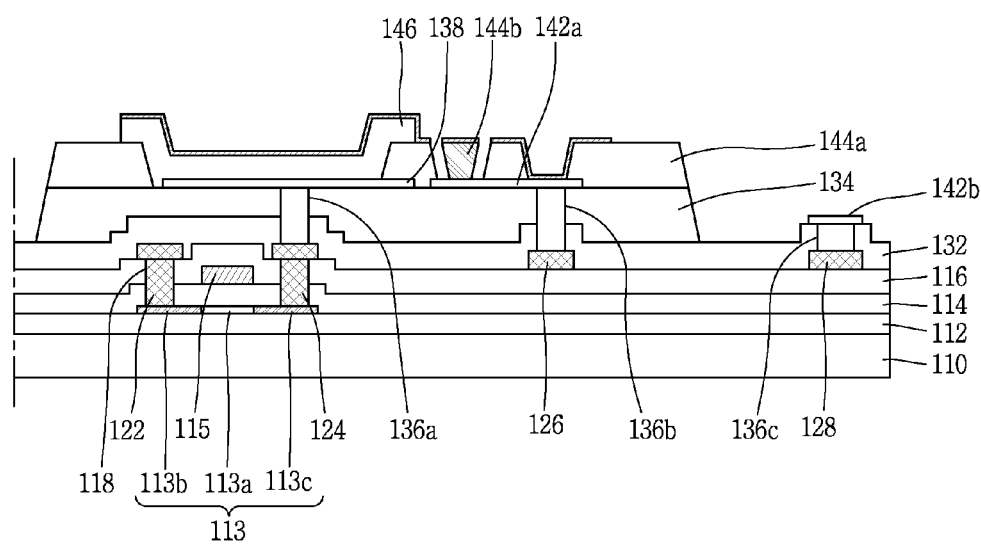

Referring to FIG. 7D, an organic emitting layer 146 having a multilayer structure is formed at a front surface of the substrate 110 including the bank 144a and the voltage drop prevention pattern 144b. When forming the organic emitting layer 146, thermal deposition using a shadow mask (not shown) having an opening portion and a blocking area is used to form the organic emitting layer 146 in a region surrounded by the bank 144a within each pixel area. The organic emitting layer 146 may be formed by including red, green and blue organic emission patterns (not shown) that emit red, green and blue colors, or with a white organic emission pattern (not shown) that emits white color. Thermal deposition using a shadow mask is performed three times when the organic emitting layer 146 is formed with red, green and blue organic emission patterns whereas thermal deposition using a shadow mask is performed once when the organic emitting layer 146 is formed with only a white organic emission pattern.

Figure 7E:
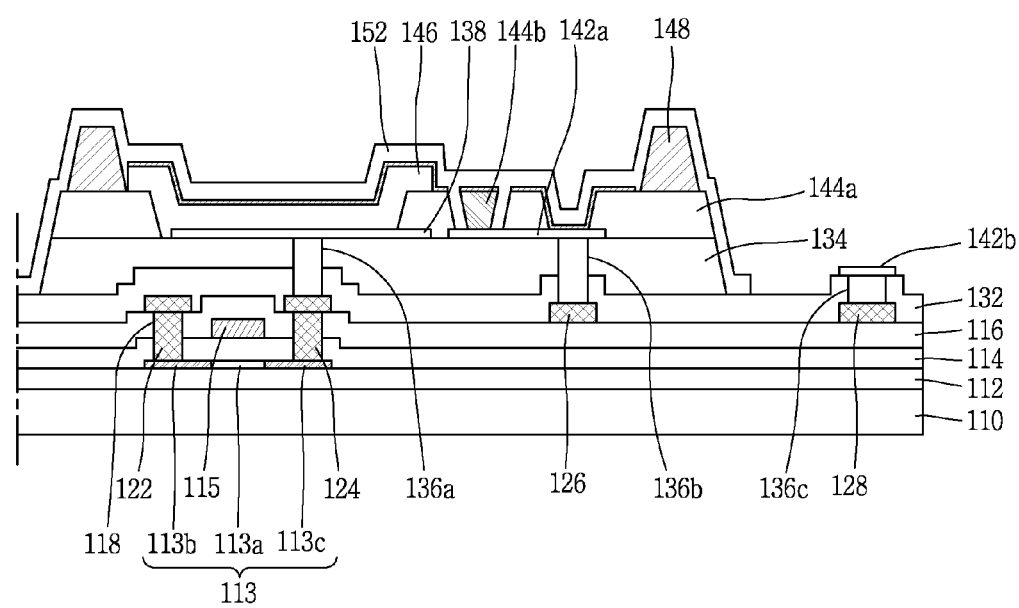

Referring to FIG. 7E, a transparent conductive material such as indium tin oxide (ITO) or indium zinc oxide (IZO), for example, is deposited at a front surface of the substrate 110 including the organic emitting layer 146. The transparent conductive material is pattered by performing a mask process to form the second electrode 152.

When the second electrode 152 is formed of indium tin oxide (ITO) or indium zinc oxide (IZO), a step coverage characteristic may be enhanced. As a result, the second electrode 152 can be formed between the bank 144a and voltage drop prevention pattern 144b and between the voltage drop prevention pattern 144b and bank 144a on the third auxiliary electrode 142a even though the voltage drop prevention pattern 144b is formed in an inverse tapered shape. As a result of forming the second electrode 152 in this manner, the second electrode 152 can be directly and electrically coupled to the third auxiliary electrode 142a without forming a contact hole.

In another embodiment where the first electrode 138 and second electrode 152 are configured with a cathode electrode and an anode electrode, respectively, the process can be carried out simply by changing materials constituting the first and the second electrode 138, 152 with each other.

Though not shown in the drawing, a seal pattern (not shown) is formed along an edge of the first substrate 110 on the completed first substrate 110, and the second substrate 170 having a transparent material is placed to face the first substrate 110. In one embodiment, the first and the second substrate 110, 170 are assembled with each other in an inert gas environment or vacuum environment to fabricate a top emission type organic electro-luminescence device according to an embodiment of the present invention.

On the other hand, a voltage drop prevention pattern of the organic electro-luminescence device according to the foregoing fabrication method is a separation space between adjacent banks having a structure in which a second electrode, i.e., cathode electrode, is deposited and directly brought into contact with a third auxiliary electrode, and there may occur a case that the cathode electrode is not normally brought into contact with the third auxiliary electrode due to its narrow separation space.

Hereinafter, an organic electro-luminescence device and a method of fabricating the same in which the foregoing problem is minimized according to the second embodiment of the present invention will be described.

Similarly to the first embodiment, the second embodiment relates a method of fabricating a top emission type organic electro-luminescence device in which the first electrode coupled to a drain electrode of the driving transistor performs the role of an anode electrode and the second electrode performs the role of a cathode electrode.

FIGS. 8A through 8E are process cross-sectional views for each fabrication step illustrating one pixel area of an organic electro-luminescence device according to a second embodiment of the present invention.

Figure 8A:
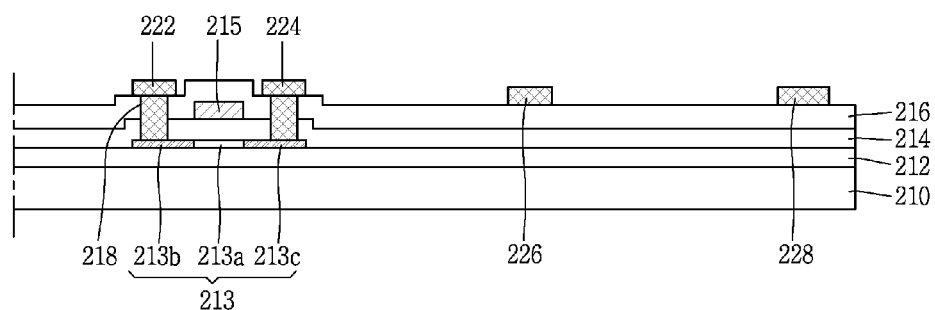
FIGS. 8A through 8E are process cross-sectional views for each fabrication step illustrating one pixel area of an organic electro-luminescence device according to a second embodiment of the present invention.

According to the method of fabricating an organic electro-luminescence device in accordance with an embodiment 2 of the present invention, an inorganic insulating material made of silicon oxide (SiO2), silicon nitride (SiNx), or the like is deposited on the insulating substrate 210 to form the buffer layer 212 as illustrated in FIG. 8A. The step of forming the buffer layer 212 may be omitted.

Next, amorphous silicon is deposited on the buffer layer 212 to form an amorphous silicon layer (not shown), and then the amorphous silicon layer is crystallized into a polysilicon layer (not shown) by irradiating a laser beam or performing a thermal processing on the amorphous silicon. Then, a mask process is performed to pattern the polysilicon layer (not shown), thereby forming the semiconductor layer 213 in a pure polysilicon layer state.

Subsequently, silicon oxide (SiO2), for example, is deposited on the semiconductor layer 213 with pure polysilicon to form the gate insulating layer 214. Then, a low resistance metal such as molybdenum tungsten (MoW), aluminium (Al), aluminium alloy (ALNd), copper (Cu) or the like is deposited on the gate insulating layer 214 to form a first metal layer (not shown), and a mask process is performed on the first metal layer to form the gate electrode 215 on the gate insulating layer 214 corresponding to the first area 213a of the semiconductor layer 213. At this time, though not shown in the drawing, a gate wiring (not shown) electrically coupled to the gate electrode is also formed.

Next, an impurity, i.e., a group III element or group V element, is doped into a front surface of the substrate 210 using the gate electrode 215 as a blocking mask to form the second areas 213b, 213c which are doped with impurities at a portion located at the outside of the gate electrode 215 of the semiconductor layer 213, and the first area 213a with pure polysilicon is formed at a portion where impurities are not doped by the gate electrode 215.

Subsequently, an inorganic insulating material, for example, silicon nitride (SiNx) or silicon oxide (SiO2), is deposited at a front surface of the substrate 210 formed with the semiconductor layer 213, divided into the first and the second areas 213a, 213b, 213c, to form the interlayer insulating layer 216, and the interlayer insulating layer 216 and the gate insulating layer 214 at a lower portion thereof are simultaneously patterned by performing a mask process. The mask process also creates the first contact hole 218 for exposing the second areas 213b, 213c, respectively.

Next, a second metal layer (not shown) having a single-layer or multilayer structure, containing at least one of titanium (Ti), aluminium (Al), and titanium (Ti), for example, is formed on the interlayer insulating layer 216. The second metal layer is patterned by performing a mask process to form the source and drain electrodes 222, 224. The second metal layer is electrically coupled to the second area 213b through the first contact hole 218. At this time, the first and the second auxiliary electrode 226, 228 are formed on the interlayer insulating layer 216. The forgoing first auxiliary electrode 226 is formed to be separated from the drain electrode 224, and the second auxiliary electrode 228 is formed to be separated from the first auxiliary electrode 226.

Figure 8B:
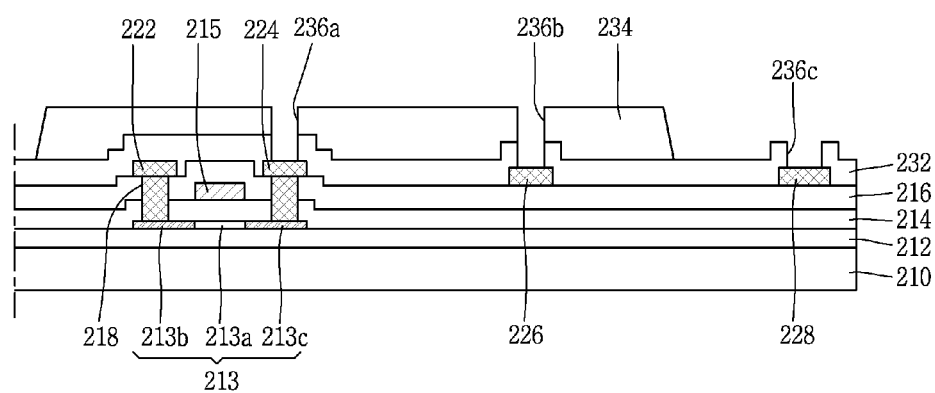

Subsequently, referring to FIG. 8B, an inorganic insulating material such as silicon nitride (SiNx) and silicon oxide (SiO$_2$) is deposited at a front surface of the insulating substrate 210 including the source and drain electrodes 222, 224 to form the first passivation layer 232. An organic insulating material such as photo acryl (PA) is deposited on the first passivation layer 232 to form the second passivation layer 234. Next, the second contact hole 236a for exposing the drain electrode 224 and the third contact hole 236b for exposing the first auxiliary electrode 226 are formed on the first and the second passivation layers 232, 234. At the same time, the fourth contact hole 236c for exposing the second auxiliary electrode 228 is formed thereon.

Figure 8C:
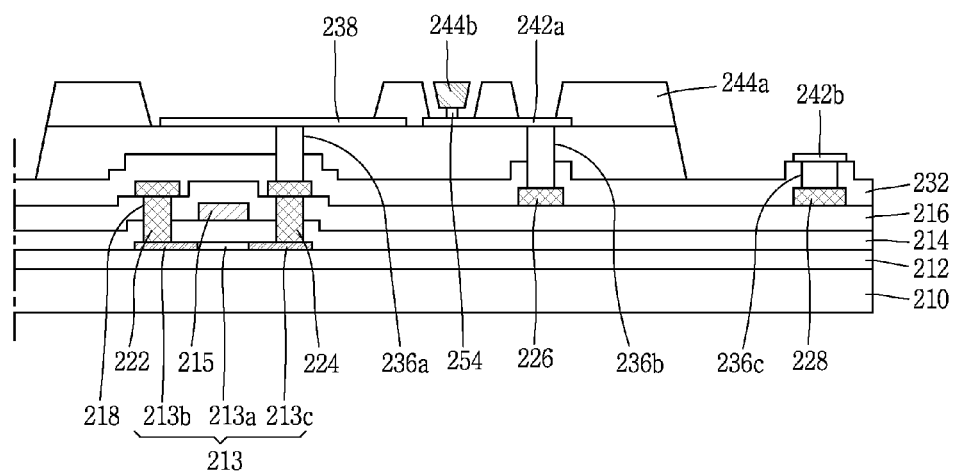

Next, referring to FIG. 8C, a third metal layer (not shown) having a multilayer structure made of at least one of indium tin oxide (ITO), silver (Ag) and indium tin oxide (ITO) is formed on the second passivation layer 234. The third metal layer is patterned by performing a mask process to form the first electrode 238 electrically coupled to the drain electrode 224 through the second contact hole 236a. At the same time, the third and the fourth auxiliary electrode 242a, 242b are formed. The third and fourth auxiliary electrodes 242a, 242b are electrically coupled to the first and the second auxiliary electrode 226, 228 through the third and the fourth contact hole 236b, 236c.

Subsequently, an insulating material such as polyimide (PI), for example, is formed on the first electrode 238. The insulating material is patterned by performing a mask process to form banks 244a at both sides of the first electrode 238. The banks 244a are formed to be overlapped with a side edge of the first electrode 238 in the shape of surrounding each pixel area.

Subsequently, a negative photo resist may be formed on the banks 244a. The negative photo resist is patterned by performing a mask process to form the voltage drop prevention pattern 244b on a side upper portion of the third auxiliary electrode 242a. In this case, the voltage drop prevention pattern 244b is formed to be separated from the bank 244a, and is formed to have an inverse tapered shape.

The voltage drop prevention pattern 244b may be configured in a double layered shape having a step such that the lower portion thereof has a width remarkably smaller than that of the upper portion thereof or configured in such a shape that a victim pattern 254 is further formed between the third auxiliary electrodes 238 at the lower portion thereof.

In particular, when the victim pattern 254 is further formed at a lower portion of the voltage drop prevention pattern 244b, a victim pattern material layer (not shown) is formed at a lower portion of the foregoing negative photoresist, and the victim pattern 254 and voltage drop prevention pattern 244b are patterned at the same time. To this end, the victim pattern material layer uses a material having a different etching selection ratio from at least one of the third auxiliary electrode 238 at the lower portion thereof and the voltage drop prevention pattern 244b at the upper portion thereof.

At least one of silicon nitride (SiNx), silicon oxide (SiO2), amorphous silicon (a-Si), aluminium (Al), aluminium-neodymium alloy (AlNd), and copper (Cu) may be used for the material forming the foregoing victim pattern 254.

According to the structure, the second electrode 252 is formed between the bank 244a and the voltage drop prevention pattern 244b and between the voltage drop prevention pattern 244b and the bank 244a on the third auxiliary electrode 242a when forming the second electrode 252 by the voltage drop prevention pattern 244b at a side upper portion of the third auxiliary electrode 242a and electrically coupled with the third auxiliary electrode 242a and the first auxiliary electrode 226. Furthermore, a space in which the second electrode 252 is deposited between a lower portion of the voltage drop prevention pattern 244b and the third auxiliary electrode 242a is further secured by the victim pattern 254.

Accordingly, when a voltage is applied through the first auxiliary electrode 226 from the outside, an area on which the first auxiliary electrode 226 is brought into contact with the second electrode 252 to be formed in the subsequent process is further secured, and the first auxiliary electrode 226 is normally deposited on the third auxiliary electrode 242a.

Figure 8D:
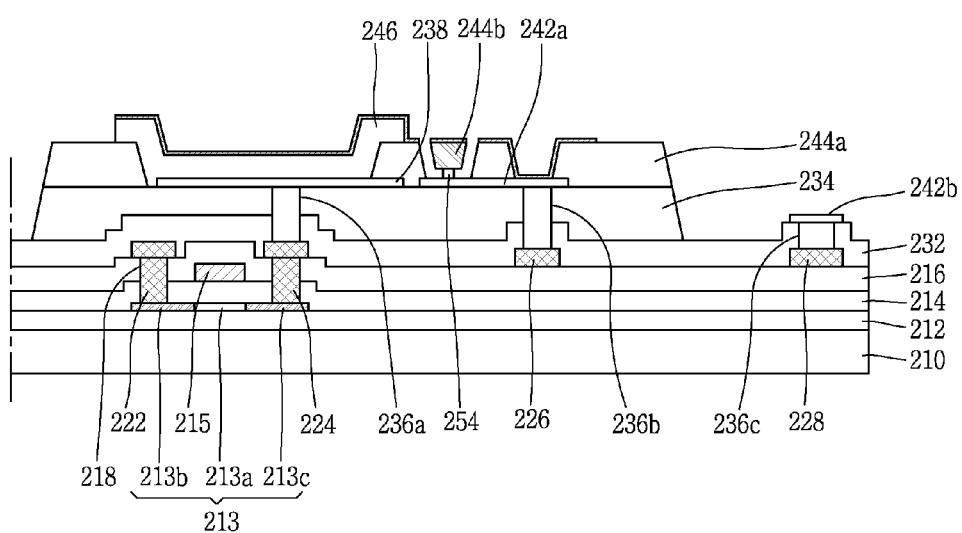

Next, referring to FIG. 8D, an organic emitting layer 246 having a multilayer structure is formed at a front surface of the substrate 210 including the bank 244a and the voltage drop prevention pattern 244b. When forming the organic emitting layer 246, thermal deposition using a shadow mask (not shown) having an opening portion and a blocking area is carried out to form the organic emitting layer 246 in a region surrounded by the bank 244a within each pixel area. The organic emitting layer 246 may be formed by including red, green and blue organic emission patterns (not shown) that emit red, green and blue colors, or with only a white organic emission pattern (not shown) that emits white color, and a shadow mask process may be also performed three times or once.

Subsequently, referring to FIG. 8E, a transparent conductive material such as indium tin oxide (ITO) or indium zinc oxide (IZO) is deposited at a front surface of the substrate 210 including the organic emitting layer 246. The transparent conductive material is patterned by performing a mask process to form the second electrode 252.

The indium tin oxide (ITO) or indium zinc oxide (IZO) has a good step coverage characteristic, and the second electrode 252 is formed between the bank 244a and voltage drop prevention pattern 244b and between the voltage drop prevention pattern 244b and bank 244a on the third auxiliary electrode 242a even though the voltage drop prevention pattern 244b is formed in an inverse tapered shape. As a result, the second electrode 252 can be directly and electrically coupled to the third auxiliary electrode 242a without forming an additional contact hole.

Figure 8E:
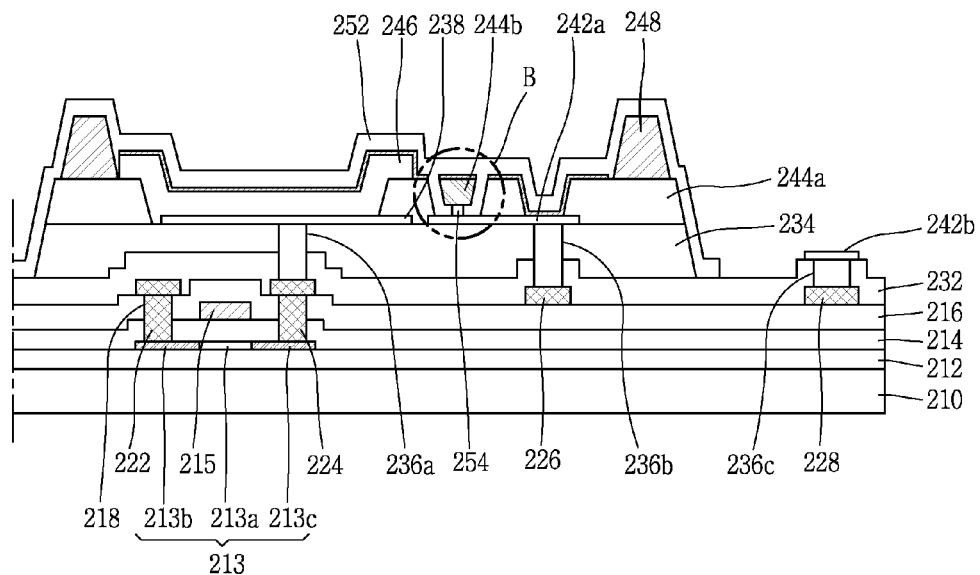
Figure 9:
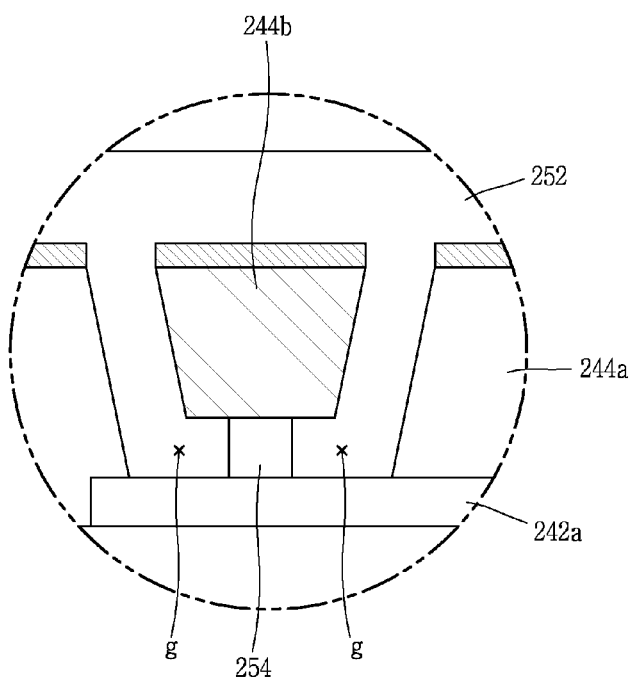
FIG. 9 is an enlarged cross-sectional view illustrating a portion B in FIG. 8E.

FIG. 9 is an enlarged view illustrating a portion B in FIG. 8E. As illustrated in the drawing, the second electrode 252 is deposited between the bank 244a and the voltage drop prevention pattern 244b and thus directly brought into contact with the exposed third auxiliary electrode 242a. In particular, a gap (g) is further secured between a lower portion of the voltage drop prevention pattern 244b and an upper portion of the third auxiliary electrode 242a by a width difference between the voltage drop prevention pattern 244b and the victim pattern 254, and the second electrode 252 is formed in the gap (g) and thus stably coupled thereto.

Hereinafter, though not shown in the drawing, a seal pattern (not shown) is formed along an edge of the first substrate 210 on the completed first substrate 210, and the second substrate (not shown) having a transparent material is bonded thereto, thereby fabricating a top emission type organic electro-luminescence device according to the second embodiment of the present invention.

Although many embodiments have been specifically disclosed in the foregoing description, they should be construed as an illustration of preferred embodiments rather than limitations to the scope of invention. Consequently, the scope of the invention should not be determined by the embodiments specifically disclosed herein but instead by the claims and equivalents thereof.

What is claimed is:

1. An organic electro-luminescence device, comprising:
    a bank layer formed over a substrate, the bank layer including a first, second, and third portion, the first, second, and third portions each being at least partially physically separated from each other;
    a first electrode formed between the first and second portions of the bank layer;
    an auxiliary electrode, at least a part of the auxiliary electrode formed between the second and third portions of the bank layer, the first electrode and the auxiliary electrode formed in contact with a same layer;
    a voltage drop prevention pattern formed on the auxiliary electrode in between the second and third portions of the bank layer;
    an organic material layer formed between the first and second portions of the bank layer; and
    a second electrode formed on the organic material, at least a portion of the second electrode electrically coupled to the auxiliary electrode.

2. The organic electro-luminescence device of claim 1, wherein the voltage drop prevention pattern is a negative photoresist.

3. The organic electro-luminescence device of claim 1, wherein the voltage drop prevention pattern has an inverse tapered shape.

4. The organic electro-luminescence device of claim 3, wherein the voltage drop prevention pattern has a top width greater than a bottom width.

5. The organic electro-luminescence device of claim 1, wherein the organic material layer is formed without physically contacting the auxiliary electrode.

6. The organic electro-luminescence device of claim 1, wherein the second electrode is between the voltage drop prevention pattern and the second portion of the bank.

7. The organic electro-luminescence device of claim 1, wherein the second electrode is between the voltage drop prevention pattern and the third portion of the bank layer.

8. The organic electro-luminescence device of claim 1, wherein at least a part of the voltage drop prevention pattern is formed between the second and third portions of the bank layer.

9. The organic electro-luminescence device of claim 1, wherein the organic material forms an emission area of the organic electro-luminescence device, and at least a portion of the voltage drop prevention pattern is formed outside of the emission area.

10. The organic electro-luminescence device of claim 1, wherein an emission area is formed between the first and second portions of the bank layer, and at least a portion of the voltage drop prevention pattern is formed outside of the emission area.

11. The organic electro-luminescence device of claim 1, wherein a height of the voltage drop prevention pattern is greater than or equal to a height of the second portion of the bank layer.

12. The organic electro-luminescence device of claim 1, wherein the voltage drop prevention pattern has a double layered inverse tapered shape having a step.

13. The organic electro-luminescence device of claim 1, wherein a victim pattern is further formed at a lower portion of the voltage drop prevention pattern.

14. The organic electro-luminescence device of claim 13, wherein the victim pattern is formed of a material having a different etching selection ratio from at least one of the auxiliary electrode and the voltage drop prevention pattern.

15. The organic electro-luminescence device of claim 14, wherein the victim pattern comprises at least one of silicon nitride (SiNx), silicon oxide (SiO2), amorphous silicon (a-Si), aluminum (Al), aluminum-neodymium alloy (AlNd), and copper (Cu).

16. A method of fabricating an organic electro-luminescence device, the method comprising:
    forming a bank layer over a substrate, the bank layer including a first, second, and third portion, the first, second, and third portions formed such that they are at least partially physically separated from each other;
    forming a first electrode between the first and second portions of the bank layer;
    forming an auxiliary electrode, at least a part of the auxiliary electrode formed between the second and third portions of the bank layer, the first electrode and the auxiliary electrode formed in contact with a same layer;
    forming a voltage drop prevention pattern on the auxiliary electrode in between the second and third portions of the bank layer;
    forming an organic material layer between the first and second portions of the bank layer; and
    forming a second electrode on the organic material layer, at least a portion of the second electrode electrically coupled to the auxiliary electrode.

17. The method of claim 16, wherein the voltage drop prevention pattern is a negative photoresist.

18. The method of claim 16, wherein the voltage drop prevention pattern has an inverse tapered shape.

19. The method of claim 16, wherein the voltage drop prevention pattern has a top width greater than a bottom width.

20. The method of claim 16, wherein the voltage drop prevention pattern prevents the organic material layer from physically contacting the auxiliary electrode while allowing the second electrode to physically and electrically couple to the auxiliary electrode while the organic material layer and the second electrode are formed.

21. The method of claim 16, wherein the organic material layer is formed without physically contacting the auxiliary electrode.

22. The method of claim 16, wherein the second electrode is formed between the voltage drop prevention pattern and the second portion of the bank layer.

23. The method of claim 16, wherein the second electrode is formed between the voltage drop prevention pattern and the third portion of the bank layer.

24. The method of claim 16, wherein at least a part of the voltage drop prevention pattern is formed between the second and third portions of the bank layer.

25. The method of claim 16, wherein the organic material forms an emission area of the organic electro-luminescence device, and at least a portion of the voltage drop prevention pattern is formed outside of the emission area.

26. The method of claim 16, wherein an emission area is formed between the first and second portions of the bank layer, and at least a portion of the voltage drop prevention pattern is formed outside of the emission area.

27. The method of claim 16, wherein a height of the voltage drop prevention pattern is greater than or equal to a height of the second portion of the bank layer.

28. The method of claim 16, wherein the voltage drop prevention pattern has a double layered inverse tapered shape having a step.

29. The method of claim 16, further comprising forming a victim pattern at a lower portion of the voltage drop prevention pattern.

30. The method of claim 29, wherein the victim pattern is formed of a material having a different etching selection ratio from at least one of the auxiliary electrode and the voltage drop prevention pattern.

31. The method of claim 30, wherein the victim pattern comprises at least one of silicon nitride (SiNx), silicon oxide (SiO2), amorphous silicon (a-Si), aluminum (Al), aluminum-neodymium alloy (AlNd), and copper (Cu).

* * * * *